(12) United States Patent
Malm et al.

(10) Patent No.: US 6,266,802 B1
(45) Date of Patent: *Jul. 24, 2001

(54) DETAILED GRID POINT LAYOUT USING A MASSIVELY PARALLEL LOGIC INCLUDING AN EMULATOR/SIMULATOR PARADIGM

(75) Inventors: Richard LaVerne Malm; Charles L. Meiley, both of San Jose; Frank Albert Nemec, II, Saratoga, all of CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/958,113

(22) Filed: Oct. 27, 1997

(51) Int. Cl.[7] .................................................... G06F 17/50
(52) U.S. Cl. .................................................. 716/12; 716/2
(58) Field of Search .................. 395/500.13, 500.14, 395/500.15; 716/1, 2, 12, 13, 14, 15, 17

(56) References Cited

U.S. PATENT DOCUMENTS

| | | | |
|---|---|---|---|
| 3,653,072 | * 3/1972 | Ballas et al. | 395/500.13 |
| 4,306,286 | 12/1981 | Cocke et al. . | |
| 4,484,292 | * 11/1984 | Hong et al. | 716/13 |
| 4,615,011 | * 9/1986 | Linsker | 395/500.14 |
| 4,752,887 | * 6/1988 | Kuwahara | 364/491 |
| 4,777,606 | * 10/1988 | Fournier | 364/491 |
| 4,890,238 | 12/1989 | Klein et al. . | |
| 4,910,680 | 3/1990 | Hiwatashi . | |
| 5,072,402 | 12/1991 | Ashtaputre et al. . | |
| 5,198,987 | 3/1993 | Shindo et al. . | |
| 5,245,550 | 9/1993 | Miki et al. . | |
| 5,341,310 | 8/1994 | Gould et al. . | |
| 5,361,214 | 11/1994 | Aoki . | |
| 5,375,069 | 12/1994 | Satoh et al. . | |
| 5,394,337 | 2/1995 | Shinjo . | |
| 5,402,359 | 3/1995 | Oyanagi . | |
| 5,434,972 | 7/1995 | Hamlin . | |
| 5,483,481 | 1/1996 | Hizume et al. . | |
| 5,500,804 | 3/1996 | Honsinger et al. . | |
| 5,551,013 | 8/1996 | Beausoleil et al. . | |
| 5,566,342 | 10/1996 | Denneau et al. . | |
| 5,583,788 | * 12/1996 | Kuribayashi | 364/400 |
| 5,636,129 | * 6/1997 | Her | 395/500.13 |
| 5,657,242 | * 8/1997 | Sekiyama et al. | 364/491 |
| 5,673,201 | * 9/1997 | Malm et al. | 395/500.13 |
| 5,717,600 | * 2/1998 | Ishizuka | 364/491 |
| 5,757,089 | * 5/1998 | Ishizuka | 307/147 |
| 5,856,927 | * 1/1999 | Greidinger et al. | 395/500.13 |

* cited by examiner

Primary Examiner—Matthew Smith
Assistant Examiner—Leigh Marie Garbowski
(74) Attorney, Agent, or Firm—Merchant, Gould, Smith, Edell, Welter & Schmidt

(57) ABSTRACT

A method and apparatus for solving grid point layouts using massively parallel computers to solve each wiring connection or grid point independently. By leaving the solution in a global perspective, and solving the problem using fine grain parallelism, wiring solutions and optimized layouts are achieved in a shorter amount of time.

13 Claims, 9 Drawing Sheets

DETAILED GRID POINT LAYOUT USING A MASSIVELY PARALLEL LOGIC INCLUDING AN EMULATOR/SIMULATOR PARADIGM

BACKGROUND OF THE INVENTION

1. Field of the Invention

This invention relates in general to electronic circuit design, and more particularly, to layout of a detailed grid point interconnect for integrated circuits.

2. Description of Related Art

The process of creating a complex integrated circuit (IC) chip design or a Printed Circuit Board (PCB) requires a wiring process that connects the inputs and outputs of each component within the design. This process is typically one of the last steps in the overall design process, so the designer is always under time pressure to finish the wiring process very quickly. Moreover, the designer wants the wiring process to optimize the circuit performance and reduce the noise interactions on the IC chip or PCB.

The IC chip and PCB designs of today contain up to 4 billion grid points across their topology, where the grid points are intersections of a three-dimensional mesh that is used as a construct to make the interconnections required by the IC chip or PCB. A "pin" is a set of grid points, not necessarily contiguous, that are defined to be electrically connected to each other. A "net" consists of pins, plus interconnect wiring that connects the pins to each other. The interconnect wiring is a sequential set of grid points such that each pair of grid points in the sequence is adjacent. The final net becomes an interconnection from one point on an IC chip to another point on the IC chip. The net should be of minimal length and may be constrained because of other design factors, e.g., noise tolerance, speed, etc., so a given net may have to be separated by a certain distance from other nets on the IC chip or PCB. Further, the design factors for a given net may include a width factor, where the net must have a width greater than one grid point, for current carrying capabilities or other reasons.

Large "nets" that connect components can be contained in an average area of less than 15 thousand grid points, and the average connection is in the range of 100 to 200 grid pins. Millions of nets per IC chip or PCB must be traced out through these grid points.

Creating optimal solutions to these large problems with today's CPU power and state-of-the-art software takes days or weeks to get usable results. The wiring process typically takes on the order of $n^2$ in time, where n is the number of grid points for the length of the path. As designs get larger, the time to complete the wiring process will take an increasingly longer time. Further, long run times discourage optimization, resulting in interconnects that may exceed a maximum length and result in poor design operation or fail due to noise problems.

When the problem is partitioned into sub areas through hierarchy or simple area partitioning, the resulting solution is not globally optimized and results in longer paths for the final net interconnects. Further, area partitioning does not allow for finding and repairing local problems, nor does it allow for weighting of interconnects on a global scale.

There is a need, then for a suitable approach to the wiring process. There is also a need for a solution that reduces the time taken to solve the wiring problem. Further, there is a need for a solution that takes less time but still optimizes the wiring process. There is also a need for finding localized problems quickly for manual intervention if necessary.

There is also a need for allowing dynamic weight changes for interconnect and grid point propagation. There is also a need for allowing dynamic grid point propagation blocking.

SUMMARY OF THE INVENTION

To minimize the limitations in the prior art described above, and to minimize other limitations that will become apparent upon reading and understanding the present specification, the present invention discloses a powerful and highly productive method and apparatus for solving a detailed grid point layout scheme.

The present invention solves the above-described problems by using a small inner loop concentrated on the nearest neighbors of the grid point, and uses a global solution technique to reduce the time required to something on the order of n, where n is the number of grid points in the average connection. This is accomplished by using massively parallel systems to trace multiple interconnects for each desired interconnect simultaneously.

A method in accordance with the principles of the present invention comprises the steps of creating a grid point model with originations and associated destinations, and also creating a weighting for each of the points within the grid point model. Interconnects can then be routed from the originations to the associated destinations, wherein the interconnect contains grid points. The weights for each of the grid points within each interconnect are then accumulated.

BRIEF DESCRIPTION OF THE DRAWINGS

Referring now to the drawings in which like reference numbers represent corresponding parts throughout.

DETAILED DESCRIPTION OF THE PREFERRED EMBODIMENT

Figure 1:
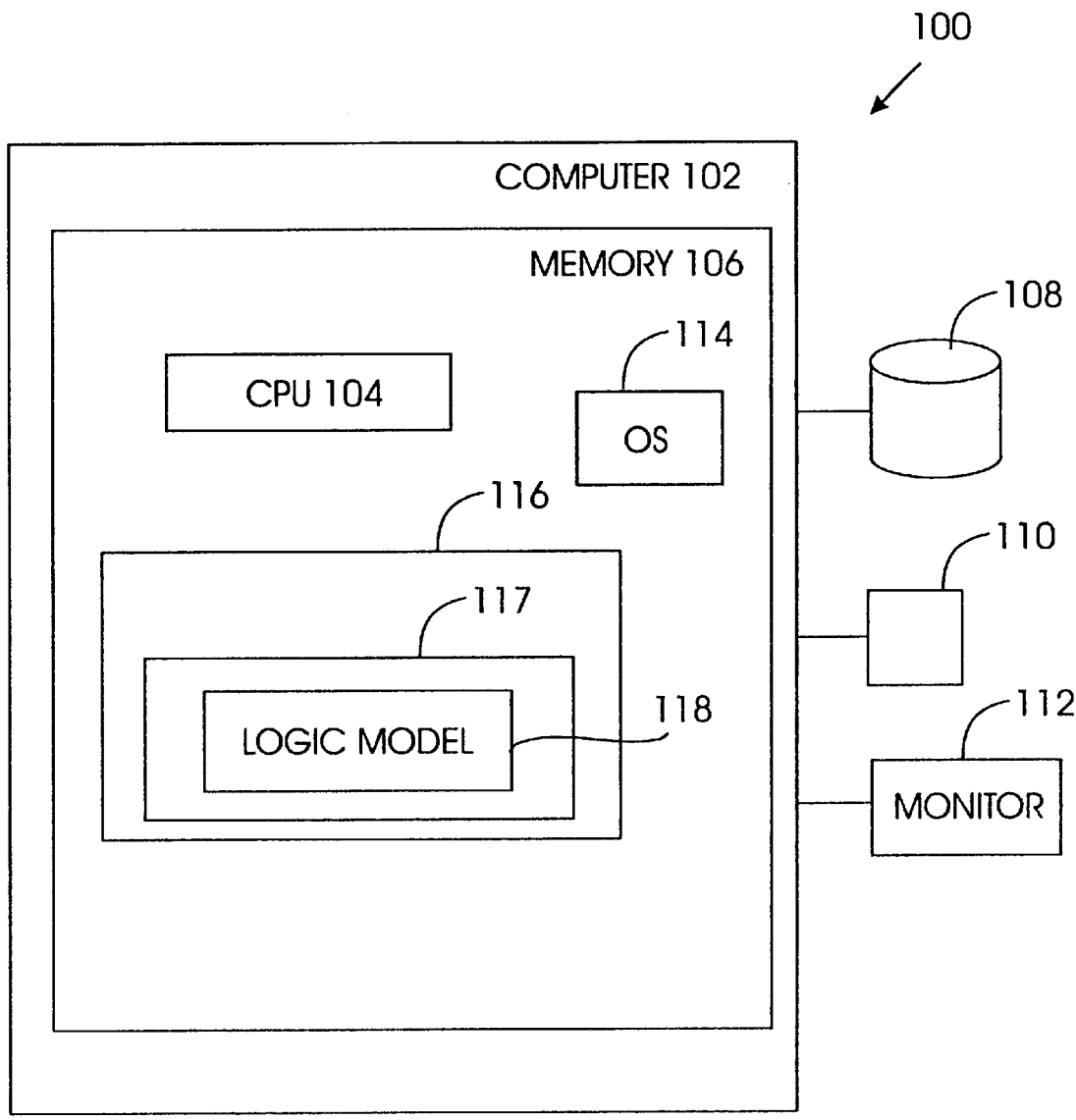
FIG. 1 illustrates an exemplary computer system that could be used to implement the present invention.

In the description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

Overview

Typical wiring of large, complex IC chip or PCB designs takes days of processing time just to get one complete interconnect solution. The long solution times have plagued the computer industry for at least a decade.

Existing auto maze or mesh wiring techniques require a sequential software program to run on one grid point at a time.

The present invention uses parallel hardware to run the core auto wire inner loop of the program, where the logic in the inner loop is quite small. This allows for much faster solutions to the wiring problem, even with large numbers of grid points to process.

The present invention approaches the wiring problem by using a three-dimensional grid or mesh approach. Each grid point is an intersection in the grid, and has adjacent grid points that are referred to as the north, south, east, west, up, or down connection to that grid point.

A subset of the grid points are allocated as being component pins. A net is a sequential set of grid points such that each pair of grid points in the sequence is adjacent. The net must connect the grid points together. The end points of the net are referred to as "Frompoints" and "Topoints".

To properly route signals on the IC chip or PCB, no net can contain grid points that are in another net. Further, some nets are considered critical and may have a spacing restriction to be more than a fixed number of grid points, greater than one, away from other critical nets to avoid induced noise. Another key feature of the problem is that the directions that a net can travel in the 3 dimensional space are restricted by blockages (grid points that can not be used or are already used by some other net) and by directional weights on the connections between the grid points. Directional weights allow the solution to be biased towards the design style of interest.

These weights are adjusted by the direction of the input to a given grid point. The weighting increases the cost of a jog or decrease the cost of a stacked via when that approach is the best choice. The weights thus deliver a cost driven optimized solution to the wiring problem. For example, a candidate interconnect path arriving at a grid point from the west may be assigned a higher weight than another arriving from the north.

Routing Process Overview

For a given layout, each grid point has a number of constraints that must be programmable depending on the specific attributes of each IC chip or PCB problem. For example, each grid point may require independently set weights on the outputs and these weights are dynamically alterable during a full IC chip or PCB run.

An origination or starting point, called a "Frompoint," is selected. The six nearest neighbor grid points to the Frompoint are checked to see if the weights on those grid points allow the current interconnect (also called a wire or trace) to propagate to any of the six nearest neighbors of the Frompoint, e.g., to the north, south, east, west, up, or down grid point. The logic model for each grid point includes memory to store the direction from which a grid point was accessed from and what grid point a given grid point propagated to. This memory is referred to as the "latches" part of the logic model, and each grid point contains latches sufficient to store where the input came from and where the output went to. Other dimensions, e.g., 45 degree in any direction, as well as additional latches are possible with the present invention.

After each propagation to the nearest neighbor grid points, the process is repeated until the wire reaches a destination or "Topoint" in the net. The present invention allows all of the grid point's logic models to verify their inputs simultaneously, and continuously, until they receive an input and propagate the output to their nearest neighbor grid points. The present invention allows for the routing or tracing of many nets in parallel where the search areas for the interconnects do not overlap.

Once a latch is set for a given grid point, the input lines for that grid point are disabled to preclude inputs that arrive at that grid point at a later time. Each grid point logic model also contains a way to store that it is going to be a starting or ending point. Since a processor can know the x,y,z of the end points or "Topoints", all that needs to be stored in the hardware is an id count for each "Topoint".

To save processing time of the maze route, a small amount of hardware (in the logic model of a grid point) provides traceability through net points and reports which input latch at each net grid point was set. To perform these functions, each grid point logic model passes a traceability done flag on to the nearest neighbors, and when a grid is active the state data is presented on a tri-state bus which can be processed with the control program to get, the x,y,z traceability information. As the "Topoint" is reached by various interconnects, the interconnect with the shortest length or lowest weighting is the path selected for that interconnect, and the latches for that interconnect are set as blocked in reverse order. All other latches are cleared for use by other interconnects.

Traceback is the process of stepping backward through the interconnect path to record the path and/or to mark the grid points blocked. Traceback starts at the point where the interconnect successfully reached the Topoint, and then reverses through the interconnect path to see which nearest neighbor accessed the Topoint. This retracing of the interconnect continues until the Frompoint for that interconnect is reached.

The invention can use gate delays for the weights within the logic model or pass the weights directly. As soon as a grid point gets set and propagates the transition, it goes idle and can be allocated to do more work, however, system communications and complexity can be simplified if the grid point is left idle, since the grid point logic model is inexpensive.

The logic model of the present invention is programmable so trade-offs between the amount of logic in the grid point logic model and the size limitations of the hardware can be made. To increase the electrical isolation of a critical net, any grid point adjacent to the grid points in the critical net can be blocked or given higher weights. Augmenting the logic model to compute and use congestion allows the logic model to be used for global wiring instead of detailed wiring. Global wiring defines the net path as a rough path without containing the fine details of the specific grid points, whereas detail wiring takes the global wiring solution and computes the detailed grid point solution. Global wiring, for example, might be a band that is plus or minus 30 grid points from the final interconnect. When a net has been partially interconnected, any interconnect that is electrically connected to a Topoint can be made to look like or emulate that Topoint. Thus, a path that reaches this interconnect is just as good as a path that reaches the Topoint.

To implement dynamic noise analysis blocking controls that can be used with gates that control a specific set of grid point outputs, block these grid points based on the existence of adjacent grid points that are within the domain of a critical net. Congestion for the logic model can also be computed and then used for global wiring instead of detailed wiring.

Tie Breaking

There will be times when two nets have the same weight or score when reaching the "Topoint." The invention includes techniques to improve interconnect quality as well as make the traceback process run faster. Logic can be added to the grid point model process to select between situations with little processing time penalty.

For example, interconects that use vias (up and down inputs) that tie with the planar interconnects of north, south, east, west should result in the use of the planar interconnect. This logic can be built into the logic model to ensure that the model is checked for specific movements or jogs in the interconnect to ensure that the best interconnect is selected for each signal.

The invention can be programmed to keep nets going in the same direction, that is "north-south" running or "east-west" running.

Hardware Environment

FIG. 1 is an exemplary hardware environment 100 used to implement the preferred embodiment of the invention. The present invention is typically implemented using a computer 102, which generally includes, inter alia, a processor 104, random access memory (RAM) 106, data storage devices 108 (e.g., hard, floppy, and/or CD-ROM disk drives, etc.), data communications devices 110 (e.g., modems, network interfaces, etc.), monitor 112 (e.g., CRT, LCD display, etc.), a mouse pointing device and a keyboard. It is envisioned that attached to the computer 102 may be other devices such as read only memory (ROM), a video card, bus interface, printers, etc. Those skilled in the art will recognize that any combination of the above components, or any number of different components, peripherals, and other devices, may be used with the computer 102.

The computer 102 operates under the control of an operating system (OS) 114, such as Windows, OS/2, Unix, etc. The operating system 114 is booted into the memory 106 of the computer 102 for execution when the computer 102 is powered-on or reset. In turn, the operating system 114 then controls the execution of one or more computer programs by the computer 102. The present invention is generally implemented in these computer programs, which execute under the control of the operating system 114 and cause the computer 102 to perform the desired functions as described herein.

The operating system 114 and computer programs, namely the routing tool 116, the routing tool memory 117, and the logic model 118, are comprised of instructions which, when read and executed by the computer 102, causes the computer 102 to perform the steps necessary to implement and/or use the present invention. Generally, the operating system 114, routing tool 114, and/or logic model 116 are tangibly embodied in and/or readable from a device, carrier, or media, such as memory 106, data storage devices 108, and/or data communications devices 110. The routing tool is typically at least one and preferably a set of parallel processors running the logic model for various interconnects within the system. Under control of the operating system 114, the routing tool 116 and logic model 118 may be loaded from the memory 106, data storage devices 108, and/or data communications devices 110 into the memory 106 of the computer 102 for use during actual operations.

Thus, the present invention may be implemented as a method, apparatus, or article of manufacture using standard programming and/or engineering techniques to produce software, firmware, hardware, or any combination thereof. The term "article of manufacture" (or alternatively, "computer program carrier") as used herein is intended to encompass any device, carrier, or media that provides access to a computer program performing the same or similar functionality. Of course, those skilled in the art will recognize many modifications may be made to this configuration without departing from the scope of the present invention.

Those skilled in the art will recognize that the exemplary environment illustrated in FIG. 1 is not intended to limit the present invention. Indeed, those skilled in the art will recognize that other alternative hardware environments may be used without departing from the scope of the present invention.

Although the invention is described herein in terms of a computer implemented solution, other embodiments for implementing the present invention are envisioned. Workstation cards can be built just for the interconnect task. The invention could also be embodied as an analog cellular neural network IC chip which might have 10,000 programmable logic grid points per IC chip. Another embodiment for the present invention is image processing chips/card/ systems that allow decisions to be made based on neighbor image point states. Further, logic emulation, programmable gata arrays, programmable logic arrays, and custom configurations are other possible embodiments for the present invention.

Using the Logic Model

Figure 2:
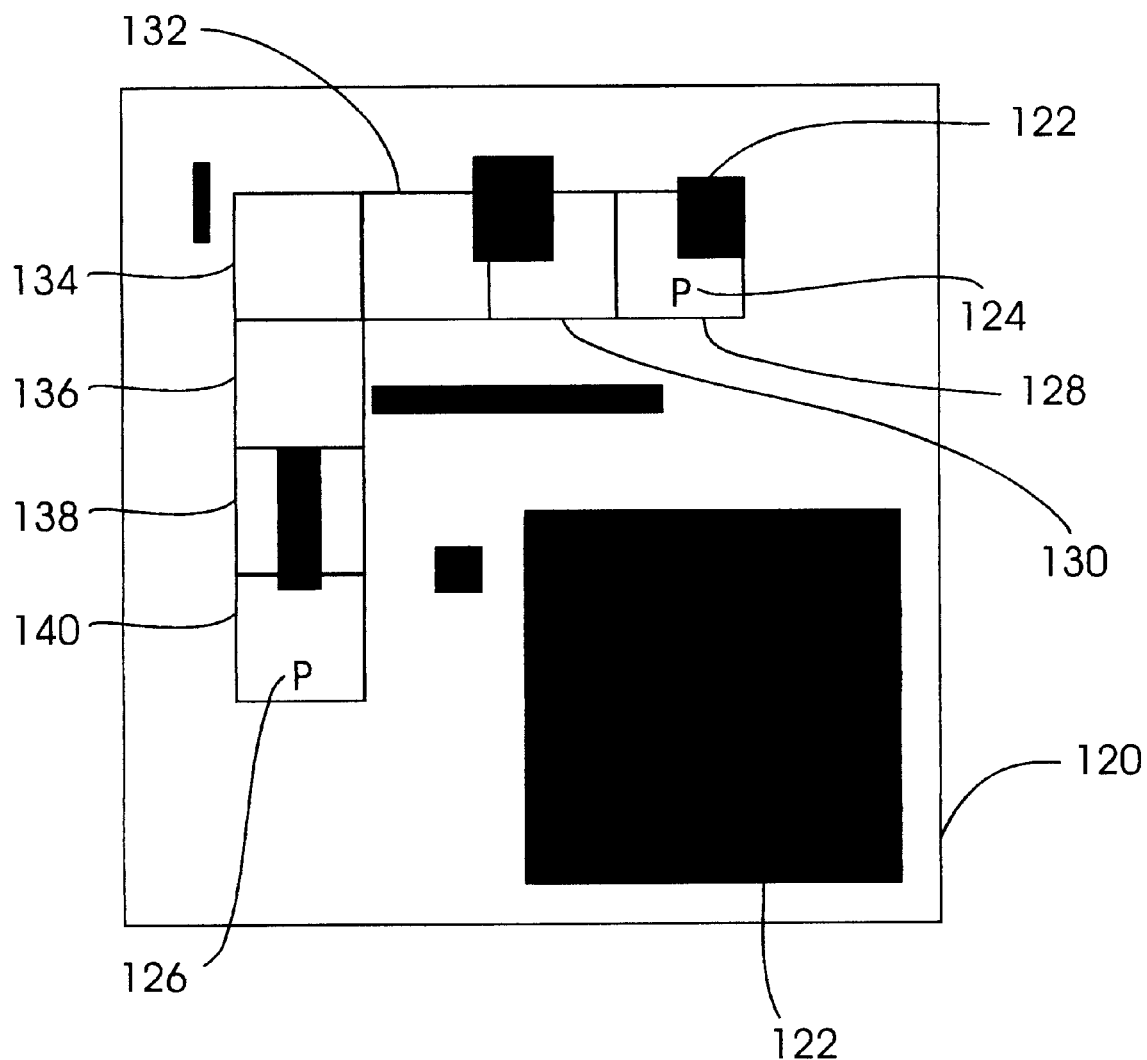
FIG. 2 shows a IC chip or PCB layout which will be used in the present invention.

FIG. 2 shows a chip layout 120 which will be used in the present invention. Chip layout 120 contains blocked areas 122 which are either used by devices and thus, connecting interconnects cannot be connected through these areas, or blocked areas 122 contain a device that is electrically connected to the chip layout 120 such that a interconnect would electrically disrupt the operation of that portion of the chip. The blocked areas 122 are not available for the computer 102 to route a interconnect through for a given signal on the chip.

Frompoint 124 and Topoint 126 are shown as the origination and destination points for a signal to be routed on the chip layout 120. The computer 102, routing tool 116, and logic model 118 will determine the actual path of the interconnect between Frompoint 124 and Topoint 126. Routing tool 116, as embodied by parallel processors, running logic model 118 in parallel, run interconnects simultaneously from various Frompoints 124 to various Topoints 126.

Chip layout can be divided up into sectors 128–140 (also known as "pages") as shown in FIG. 2. Sectors 128–140 can be anywhere on the chip layout 120, and are drawn as shown in FIG. 2 for illustration only.

Figure 3:
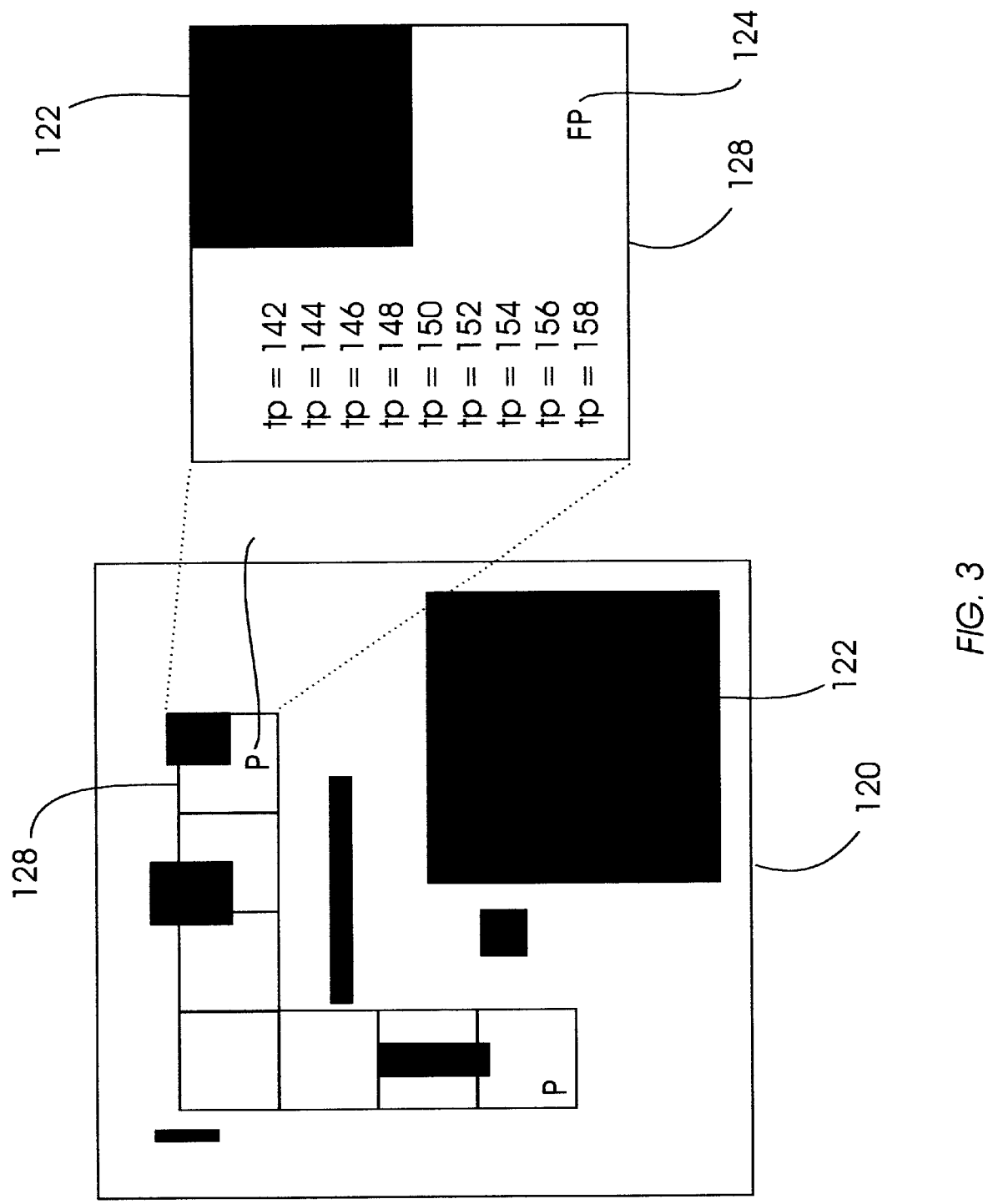
FIG. 3 shows a close up of a sector on the IC chip or PCB layout as utilized in the present invention.

FIG. 3 shows a close up of a sector on the chip layout as utilized in the present invention.

Sector 128 contains Frompoint 124 and a blocked area 122. Computer 102, routing tool 116 and logic model 118 will route several interconnects in parallel from the Frompoint 124 to the Topoint 126 and accumulate a running cost total for each interconnect. The interconnects shown are for illustration purposes only.

Computer 102, routing tool 116, and logic model 118 create grid points at the edge of sector 128. These grid points, tp 142–158, are the possible points at which the final interconnect will pass through. Tp 142–158 are not all the possible grid points that the interconnect can pass through, and are shown for illustration purposes only. Computer 102, routing tool 116, and logic model 118 would typically use every tp that was on the edge of sector 128.

Figure 4:
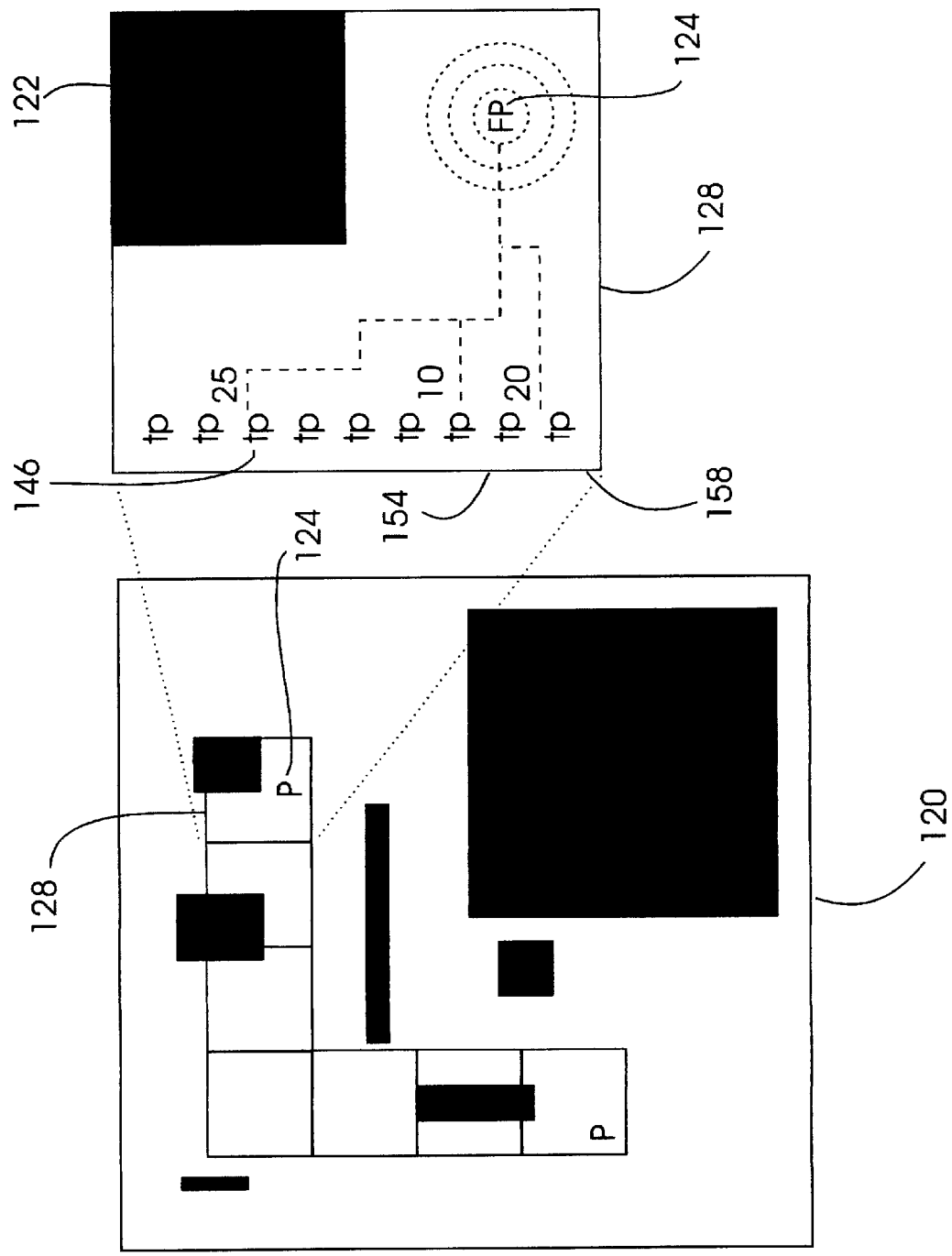
FIG. 4 shows the interconnect designs created by the present invention.

FIG. 4 shows the interconnect designs created by the present invention. Computer 102 and routing tool 116 then begin creating a interconnect to each of the tp 142–158 and accumulating a length, or "score" for each interconnect. For ease of illustration, only three interconnects are shown in FIG. 4. As shown, the length or score for the interconnect from the Frompoint 124 to tp 146 is 25, the score for the interconnect to tp 154 is 10, and the score for the interconnect to tp 158 is 20. Different paths are chosen for each tp depending on the weighting or tie breaking for each interconnect path.

Figure 5:
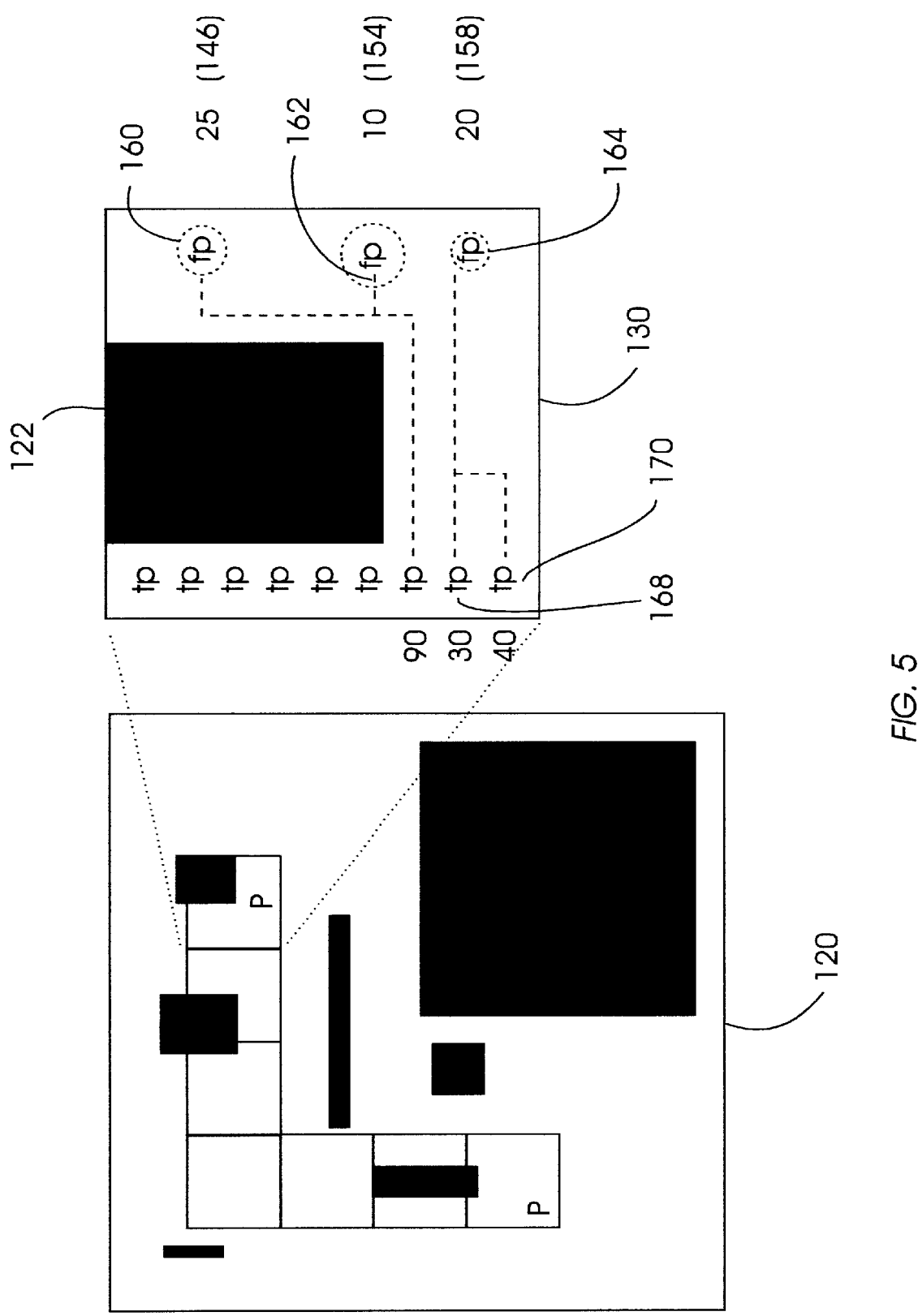
FIG. 5 shows the continuation of the interconnect created by the present invention.

FIG. 5 shows the continuation of the interconnect created by the present invention.

As the interconnect leaves sector 128 and enters sector 130, the computer 102, routing tool 116, and logic model 118 continue to draw the interconnect through additional sectors until the interconnect is complete. The interconnect costs are accumulated through the next and succeeding sectors to account for a shortest (least cost) overall interconnect from the Frompoint 124 to the Topoint 126.

Within each sector, as shown in sector 130, there are intermediate Frompoints and Topoints for each interconnect. The new fp 160–164 are the new starting points for the three interconnects. There are also new tp 166–170 for sector 130. The cumulative score for each tp is shown; for tp 166, the score is 90; for tp 168, the score is 30, and for tp 170, the score is 40.

This process of creating new fp's and tp's for each sector continues until the sector containing the Topoint 126 is reached, and cumulative scores for each interconnect can be determined.

Figure 6:
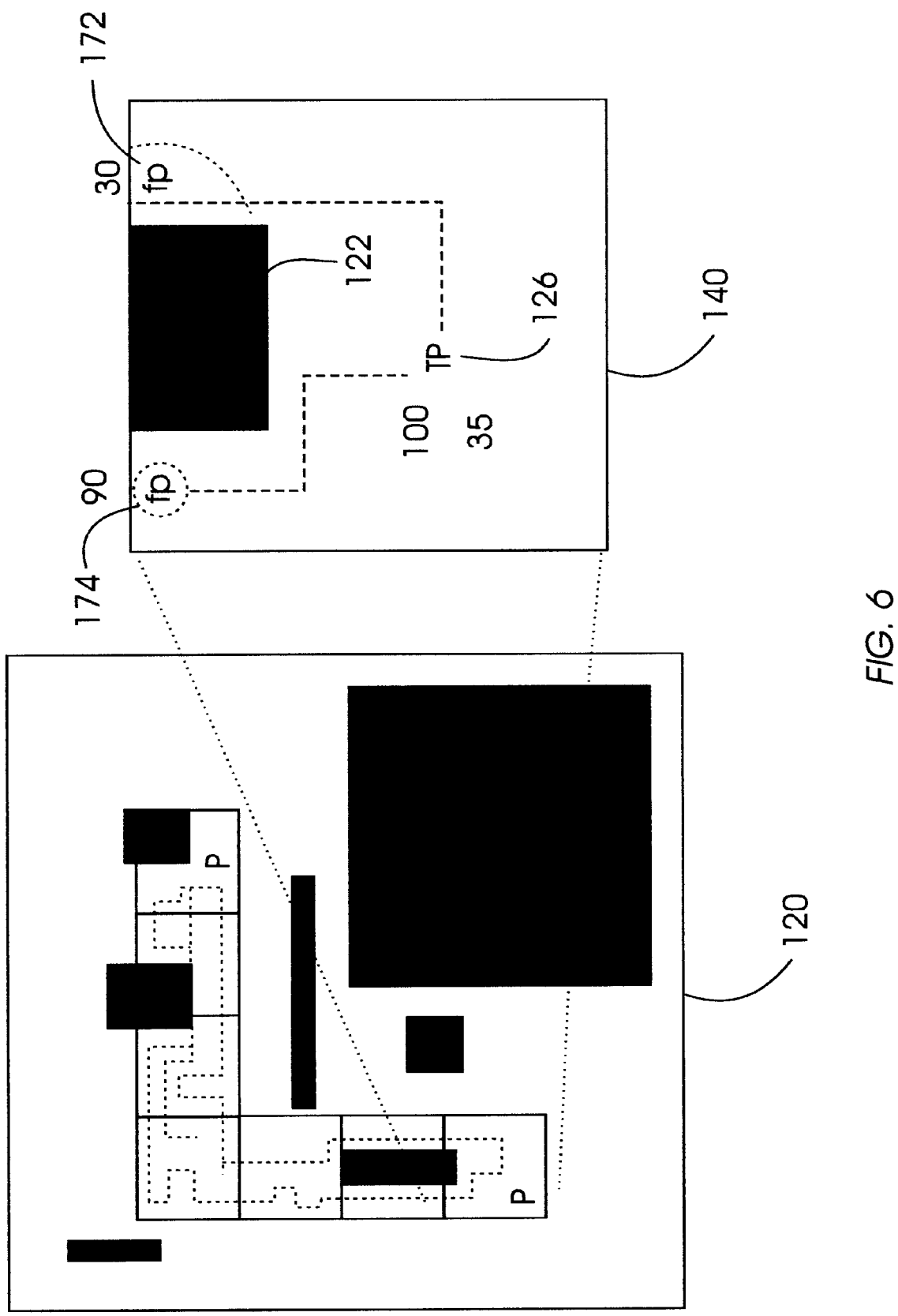
FIG. 6 shows the completion of the interconnects is created by the present invention.

FIG. 6 shows the completion of the interconnects created by the present invention. Again, sector 140 contains blocked area 122, and contains local fp's 172 and 174. Sector 140 also contains the Topoint 126, which is the end point for the interconnect to be constructed. Cumulative totals for each interconnect are listed at the fp 172 and 174.

Each interconnect is brought to the Topoint 126 and the totals are calculated. For the interconnect from fp 174, the total score is 100; for the interconnect from fp 172, the total is 35. This total is determined not only by the length of the interconnect, but by the weightings given by the logic model 118 of the present invention. Thus, by running several, or several hundred, interconnects in parallel to the Topoint 126, the best overall interconnect "score" is determined.

Figure 7:
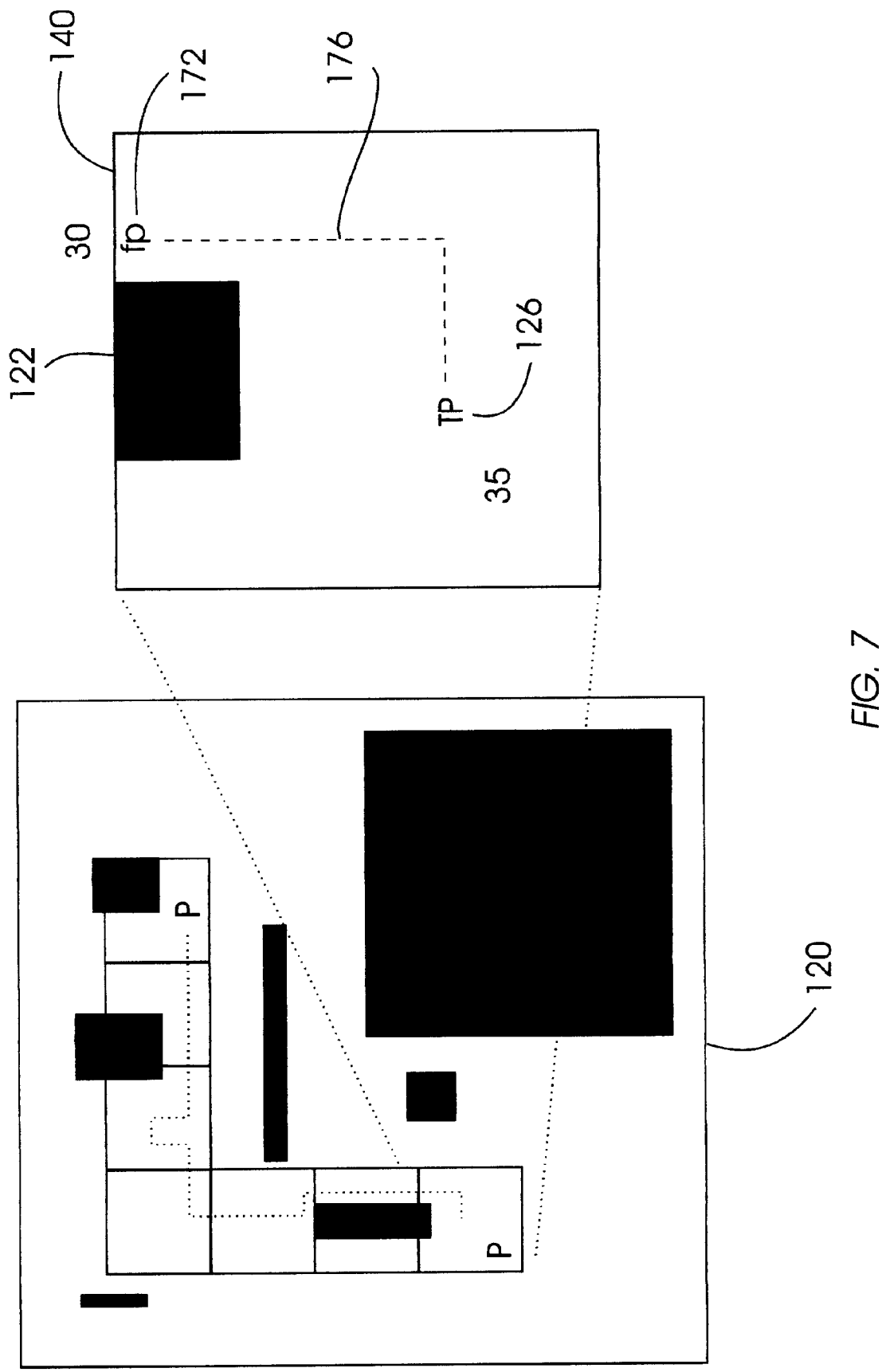
FIG. 7 shows the removal of the non-selected parallel interconnects by the present invention.

FIG. 7 shows the removal of the non-selected parallel interconnects by the present invention. Once the computer 102, routing tool 116 and logic model 118 determine the best path from the Frompoint 124 to the Topoint 126, the remaining paths must be cleared from the memory of the computer 102 to allow other interconnects to use those areas on the chip layout 120. FIG. 7 shows that only one interconnect, interconnect 176, remains on the chip layout 120 to be blocked out by the computer 102.

Figure 8:
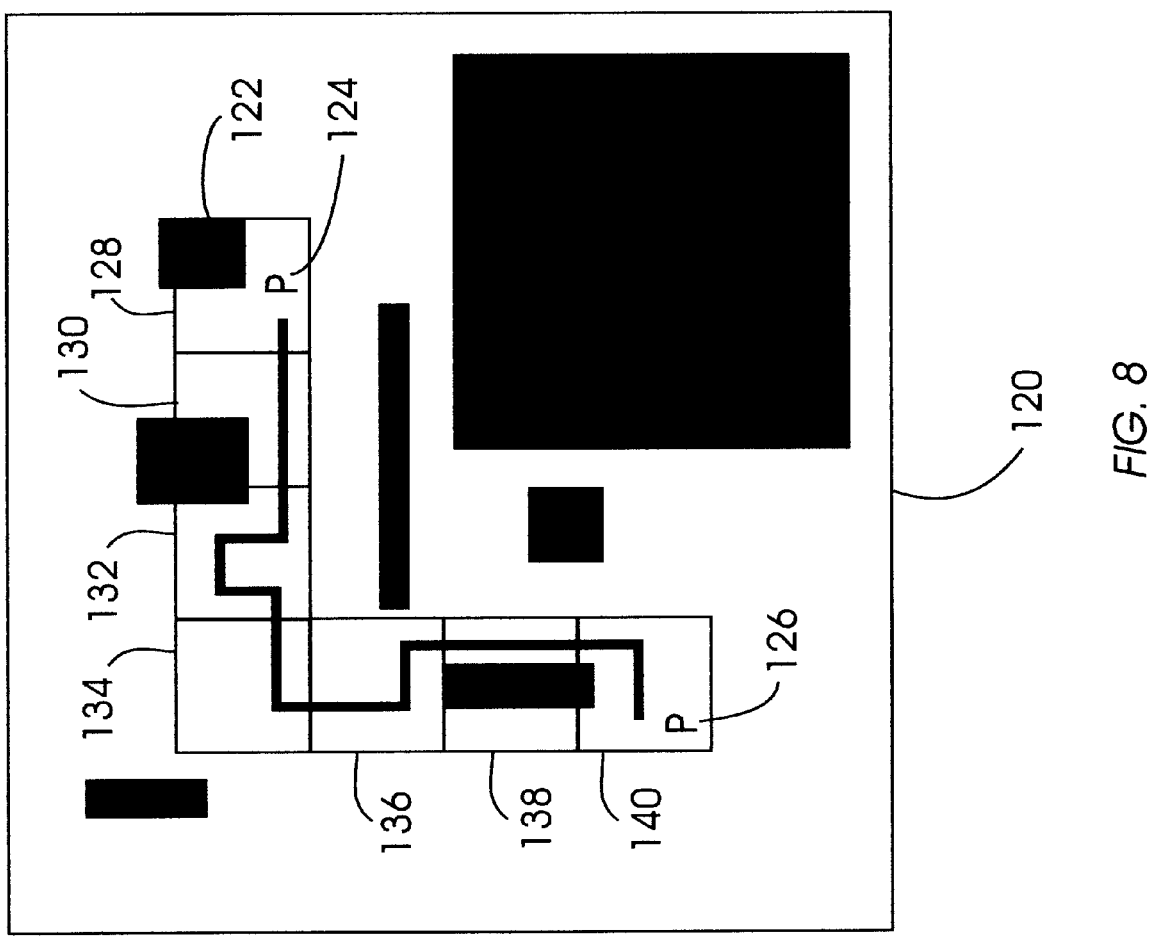
FIG. 8 shows the IC chip or PCB layout after using the present invention.

FIG. 8 shows the chip layout after using the present invention. Interconnect 176 is the final interconnect used to connect the Frompoint 124 to the Topoint 126. Interconnect 176 takes into account the weightings and blocked areas 122 that are present on the chip layout 120 in a global sense, rather than a localized sense. This is evident especially in sector 132, where interconnect 176 is not straight through sector 132 but serpentines through sector 132, because of the weightings built into the global model of chip layout 120, as well as the routing model 110 and the logic model 118.

Appendices 1–3 illustrate one possible embodiment of computer code that would be resident on computer 102 to build the routing model 110 and logic model 118 of the present invention. Once the logic model 118 for grid points on a given chip layout 120 is defined, a model for the entire page or sector of the routing problem is compiled. The logic model 118 is then loaded into the computer 102 for each page or sector, with the weightings of the routing tool 116 for routing the interconnects 176 to connect the given points on the chip layout 120. This allows for tie-breaking capabilities as well as special routing around sensitive or blocked areas 122 on the chip layout 120. The sectors 128–140 are then built dynamically by the computer 102 to allow for the proper number of grid points in each sector to allow for routing of the interconnects, and blocked areas 122 are dynamically built and released as the interconnects are built by computer 102. The computer then propagates interconnects from each Frompoint 124 to each Topoint 126 as illustrated in FIGS. 2–8. The final interconnects are then stored in the memory of the computer 102.

The grid point logic model 118 interconnect for a three-by-three-by-three grid (27 grid points) is shown in Appendix 1. A grid point logic model 118 module is shown in Appendix 2. Pseudo-code forming the routing tool 116 input is shown in Appendix 3.

Figure 9:
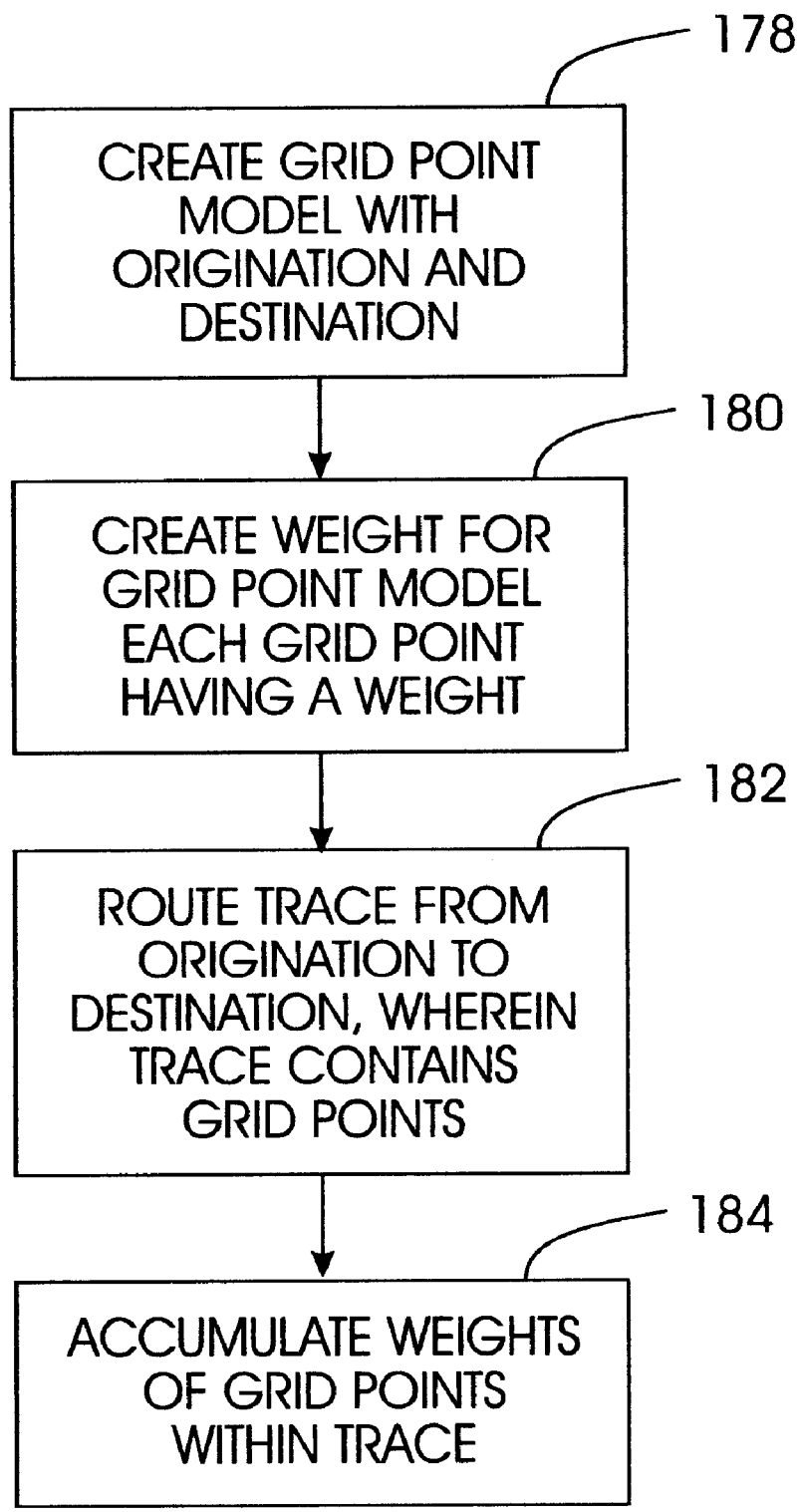
FIG. 9 shows the steps used in performing the present invention.

FIG. 9 shows the steps used in performing the present invention.

Block 178 represents the step of creating a grid point model having at least one origination and at least one destination, the origination having an associated destination.

Block 180 represents the step of creating a weighting for the grid point model, wherein each point of the model has a weight.

Block 182 represents the step of routing at least one interconnect from the origination to the associated destination, with the interconnect containing grid points.

Block 184 represents the step of accumulating the weights of the grid points within the interconnects created.

Conclusion

In conclusion, the present application discloses a method, apparatus, and article of manufacture for grid point layouts using a parallel logic model.

A method in accordance with the principles of the present invention comprises the steps of creating a grid point model with originations and associated destinations, and also creating a weighting for each of the points within the grid point model. Interconnects can then be routed from the originations to the associated destinations, wherein the interconnect contains grid points. The weights for each of the grid points within each interconnect are then accumulated.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An apparatus for implementing a wiring layout, comprising:

at least one processor having a memory;

a logic model, stored in the memory of the processor, wherein the logic model comprises a grid model for each of a plurality of grid points that includes a cost model, the cost model comprising a plurality of programmable constraints associated with each grid point; and a routing tool, stored in the memory of the processor, for executing each grid model of the logic model in parallel to identify a plurality of non-overlapping interconnects from a starting grid point to a destination grid point, the routing tool determining for each grid point in the logic model where an input came from and where an output went to, disabling input lines to a grid point to preclude further input lines becoming associated with the grid point, selecting at least one interconnect according to the cost model and tracing back through the selected interconnect to record a path for the selected interconnect.

2. The apparatus of claim 1, wherein the cost model for each of the grid points provides for tie breaking between a first interconnect and a second interconnect at a grid point in the interconnect.

3. The apparatus of claim 1, wherein the cost model for each grid point provides for noise avoidance between a first interconnect and a second interconnect within the wiring layout.

4. The apparatus of claim 1, wherein the logic model further comprises dynamic blocking of grid points within the wiring layout.

5. The apparatus of claim 1, wherein the logic model has variable spacing between grid points within the wiring layout.

6. The apparatus of claim 1, wherein the logic model can be changed dynamically during a layout implementation.

7. A method for creating wiring layouts, comprising the steps of:

establishing a logic model comprising a grid model for each of a plurality of grid points;

maintaining a cost model comprising a plurality of programmable constraints associated with each grid point;

executing each grid model of the logic model in parallel to identify a plurality of non-overlapping interconnects from a starting grid point to a destination grid point;

determining for each grid point in the plurality of interconnects for the logic model where an input came from and where an output went to;

disabling input lines to a grid point to preclude further input lines becoming associated with the grid point;

selecting at least one interconnect according to the cost model; and tracing back through the selected interconnect to record a path for the selected interconnect.

8. The method of claim 7, wherein the cost for the grid points provides for tie breaking between a first interconnect and a second interconnect at a grid point in the selected interconnect.

9. The method of claim 7, wherein the cost for the grid point provides for noise avoidance between a first interconnect and a second interconnect within the wiring layout.

10. The method of claim 7, wherein the cost for each grid point allows for dynamic blocking of grid points.

11. The method of claim 7, wherein the grid model has variable spacing between grid points.

12. The method of claim 7, wherein the grid model is changed dynamically during a layout implementation.

13. An article of manufacture comprising a program storage medium readable by a computer having a memory, the medium tangibly embodying one or more programs of instructions executable by the computer to perform method steps for synchronizing elements of an object-oriented system, the method comprising the steps of:

establishing a logic model comprising a grid model for each of a plurality of grid points;

maintaining a cost model comprising a plurality of programmable constraints associated with each grid point;

executing each grid model of the logic model in parallel to identify a plurality of non-overlapping interconnects from a starting grid point to a destination grid point;

determining for each grid point in the plurality of interconnects for the logic model where an input came from and where an output went to;

disabling input lines to a grid point to preclude further input lines becoming associated with the grid point;

selecting at least one interconnect according to the cost model; and tracing back through the selected interconnect to record a path for the selected interconnect.

\* \* \* \* \*